United States Patent
Ganesan et al.

(10) Patent No.: US 7,243,330 B1
(45) Date of Patent: Jul. 10, 2007

(54) METHOD AND APPARATUS FOR PROVIDING SELF-IMPLEMENTING HARDWARE-SOFTWARE LIBRARIES

(75) Inventors: Satish R. Ganesan, Mountain View, CA (US); Amit Kasat, Cupertino, CA (US); Sathyanarayanan Thammanur, San Jose, CA (US); Sundararajarao Mohan, Sunnyvale, CA (US); Usha Prabhu, West Lafayette, IN (US); Ralph D. Wittig, Menlo Park, CA (US)

(73) Assignee: Xilinx, Inc., San Jose, CA (US)

( * ) Notice: Subject to any disclaimer, the term of this patent is extended or adjusted under 35 U.S.C. 154(b) by 160 days.

(21) Appl. No.: 11/111,339

(22) Filed: Apr. 21, 2005

(51) Int. Cl.
G06F 17/50 (2006.01)

(52) U.S. Cl. ................ 716/18; 716/1; 716/3; 716/17

(58) Field of Classification Search ............... 716/1–3, 716/17–18
See application file for complete search history.

(56) References Cited

U.S. PATENT DOCUMENTS

| | | | |
|---|---|---|---|
| 6,175,948 B1 * | 1/2001 | Miller et al. ................ | 716/7 |
| 6,216,259 B1 * | 4/2001 | Guccione et al. ............ | 716/17 |
| 6,292,925 B1 | 9/2001 | Dellinger et al. | |
| 6,510,546 B1 * | 1/2003 | Blodget ....................... | 716/16 |
| 6,557,156 B1 * | 4/2003 | Guccione .................... | 716/17 |
| 6,622,287 B1 * | 9/2003 | Henkel ........................ | 716/2 |
| 6,668,312 B2 * | 12/2003 | Aubury ....................... | 711/170 |
| 6,856,951 B2 * | 2/2005 | Moona et al. ............... | 703/22 |
| 7,146,602 B2 * | 12/2006 | Frerking et al. ............ | 717/118 |
| 2003/0121010 A1 * | 6/2003 | Aubury ........................ | 716/4 |
| 2003/0142818 A1 * | 7/2003 | Raghunathan et al. ........ | 380/1 |

OTHER PUBLICATIONS

Xiong et al., Hardware/Software Co-design using Hirarchical Platfrom-Based Design Method, 2005, IEEE, pp. 1309-1312.*
Li. et al. New Platform-Based Orthogonal SoC Desgin Methodology, 2003, IEEE, pp. 428-432.*
Mohamed et al., Integrated Hardware-Software Platform for Image Processing Application, 2004, IEEE, pp. 1-4.*
U.S. Appl. No. 10/229,543, filed Aug. 27, 2002, Ganesan et al.
U.S. Appl. No. 10/295,687, filed Nov. 15, 2002, Ganesan et al.
U.S. Appl. No. 10/354,518, filed Jan. 30, 2003, Keller et al.
U.S. Appl. No. 10/958,962, filed Oct. 5, 2004, Mohan et al.

* cited by examiner

*Primary Examiner*—Jack Chiang
*Assistant Examiner*—Nghia M. Doan
(74) *Attorney, Agent, or Firm*—Robert Brush; Michael R. Hardaway

(57) ABSTRACT

Method and apparatus for providing self-implementing hardware-software libraries is described. One aspect of the invention relates to designing an embedded system for an integrated circuit. A hardware platform is defined. A software platform is defined having a plurality of software components, including a library. Hardware component dependency data associated with the library is identified. At least one hardware component is added to the hardware platform in response to the hardware component dependency data.

15 Claims, 5 Drawing Sheets

METHOD AND APPARATUS FOR PROVIDING SELF-IMPLEMENTING HARDWARE-SOFTWARE LIBRARIES

FIELD OF THE INVENTION

One or more aspects of the present invention relate generally to circuit design systems and, more particularly, to a method and apparatus for providing self-implementing hardware-software libraries.

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (known as a bitstream) into internal configuration memory cells that define how the CLBs, IOBs, and interconnect structure are configured. An FPGA may also include various dedicated logic circuits, such as memories, microprocessors, digital clock managers (DCMs), and input/output (I/O) transceivers.

Notably, an FPGA having embedded processor or controller circuitry is referred to as a system-on-chip (SoC). An SoC is a fully functional product having its electronic circuitry contained on a single chip. An SoC typically includes all the required ancillary hardware components to facilitate operation of the embedded processor or controller circuitry. For example, an SoC for a cellular telephone may include a microprocessor, an encoder, a decoder, a digital signal processor (DSP), random access memory (RAM), read only memory (ROM), and the like. An SoC also includes various software components, such as device drivers, operating systems (OSs), and the like.

Designers typically develop embedded systems for an FPGA using electronic design automation (EDA) software. A designer builds an embedded system using electronic descriptions of various hardware and software components. Such electronic descriptions are referred to as intellectual property (IP) libraries or IP cores. Presently, IP libraries are either pure software libraries that are meant to be linked against and used for implementation on a microprocessor, or pure hardware cores that implement themselves in FPGA fabric.

In some cases, it may be desirable to provide a software library where one or more functions are implemented using hardware. It is also desirable to make the implementation of the hardware functions transparent to the user. Accordingly, there exists a need in the art for a method and apparatus that provides self-implementing hardware-software libraries.

SUMMARY OF THE INVENTION

Method and apparatus for providing self-implementing hardware-software libraries is described. One aspect of the invention relates to designing an embedded system for an integrated circuit. A hardware platform is defined. A software platform is defined having a plurality of software components, including a library. Hardware component dependency data associated with the library is identified. At least one hardware component is added to the hardware platform in response to the hardware component dependency data.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Method and apparatus for providing self-implementing hardware-software libraries is described. One or more aspects of the invention are described with respect to an FPGA. Those skilled in the art will appreciate that the present invention may be used with other types of integrated circuits, such as application specific integrated circuits (ASICs), application specific standard products (ASSPs), complex programmable logic devices (CPLDs), and the like.

Figure 1:
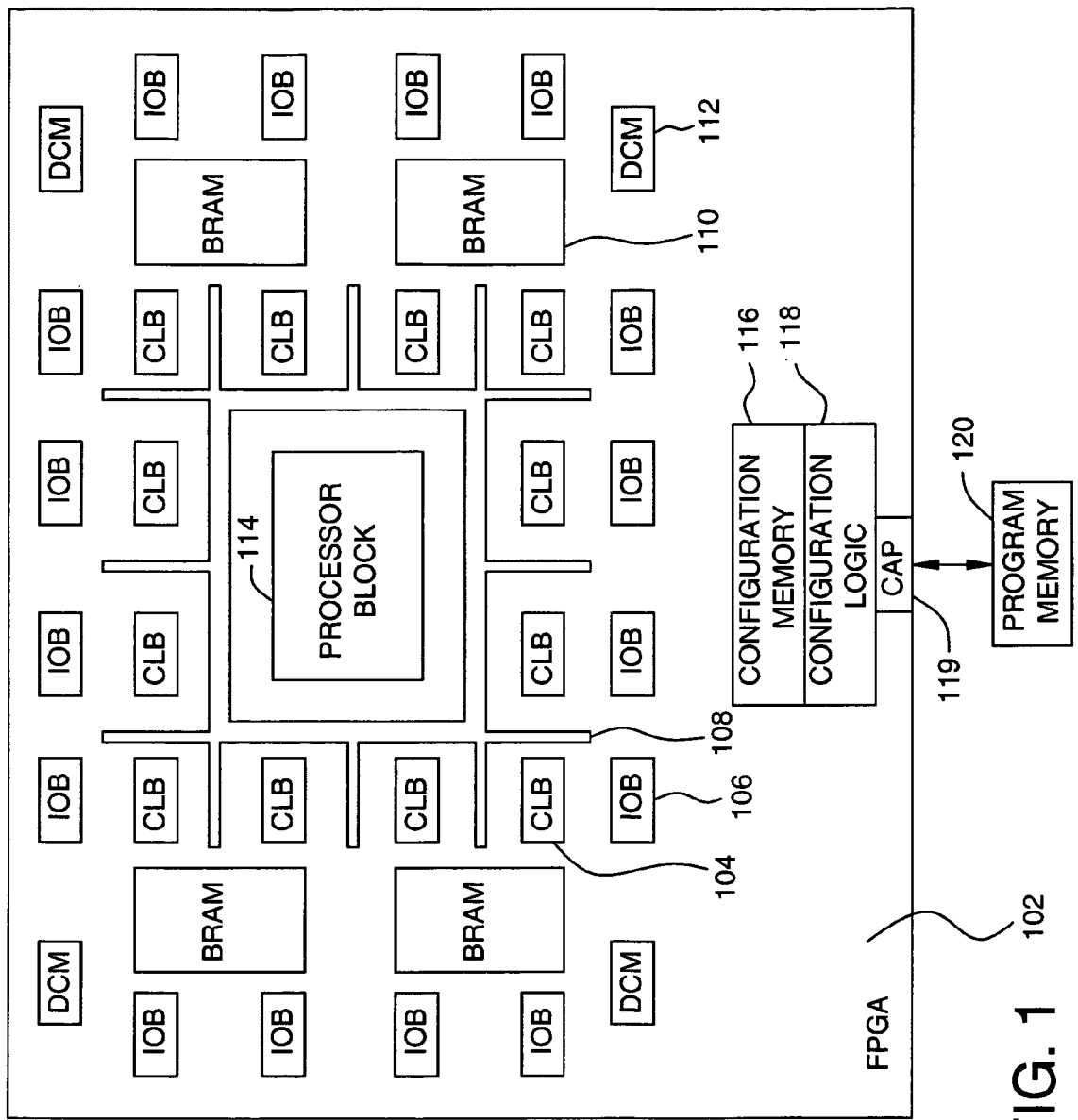
FIG. 1 is a block diagram depicting an exemplary embodiment of an FPGA coupled to a program memory.

FIG. 1 is a block diagram depicting an exemplary embodiment of an FPGA 102 coupled to a program memory 120. The FPGA 102 illustratively comprises programmable logic circuits or "blocks", illustratively shown as CLBs 104, IOBs 106, and programmable interconnect 108 (also referred to as "programmable logic"), as well as configuration memory 116 for determining the functionality of the FPGA 102. The FPGA 102 may also include an embedded processor block 114, as well as various dedicated internal logic circuits, illustratively shown as blocks of random access memory ("BRAM 110"), configuration logic 118, and digital clock management (DCM) blocks 112. Those skilled in the art will appreciate that the FPGA 102 may include other types of logic blocks and circuits in addition to those described herein.

As is well known in the art, the IOBs 106, the CLBs 104, and the programmable interconnect 108 may be configured to perform a variety of functions. Notably, the CLBs 104 are programmably connectable to each other, and to the IOBs 106, via the programmable interconnect 108. Each of the CLBs 104 may include one or more "slices" and programmable interconnect circuitry (not shown). Each CLB slice in turn includes various circuits, such as flip-flops, function generators (e.g., a look-up tables (LUTs)), logic gates, memory, and like type well-known circuits. The IOBs 106 are configured to provide input to, and receive output from, the CLBs 104.

Configuration information for the CLBs 104, the IOBs 106, and the programmable interconnect 108 is stored in the configuration memory 116. The configuration memory 116 may include static random access memory (SRAM) cells. The configuration logic 118 provides an interface to, and controls configuration of, the configuration memory 116. A configuration bitstream produced from the program memory 120 may be coupled to the configuration logic 118 through a configuration port 119. The configuration process of FPGA 102 is also well known in the art.

The DCM blocks 112 provide well-known clock management circuits for managing clock signals within the FPGA 102, such as delay lock loop (DLL) circuits and multiply/divide/de-skew clock circuits. The processor block 114 comprises a microprocessor core, as well as associated control logic. Notably, such a microprocessor core may include embedded hardware or embedded firmware or a combination thereof for a "hard" or "soft" microprocessor. A soft microprocessor may be implemented using the programmable logic of the FPGA 102 (e.g., CLBs 104, IOBs 106). For example, a MICROBLAZE soft microprocessor, available from Xilinx of San Jose, Calif., may be employed. A hard microprocessor may be implemented using an IBM POWER PC, Intel PENTIUM, AMD ATHLON, or like type processor core known in the art.

The processor block 114 is coupled to the programmable logic of the FPGA 102 in a well known manner. For purposes of clarity by example, the FPGA 102 is illustrated with 12 CLBs, 16 IOBs, 4 BRAMs, 4 DCMs, and one processor block. Those skilled in the art will appreciate that actual FPGAs may include one or more of such components in any number of different ratios. For example, the FPGA 102 may be selected from the VIRTEX-2 family of products or an alternative FPGA (not shown) may be used from a VIRTEX-4 family of products; both families commercially available from Xilinx, Inc. of San Jose, Calif.

Figure 2:
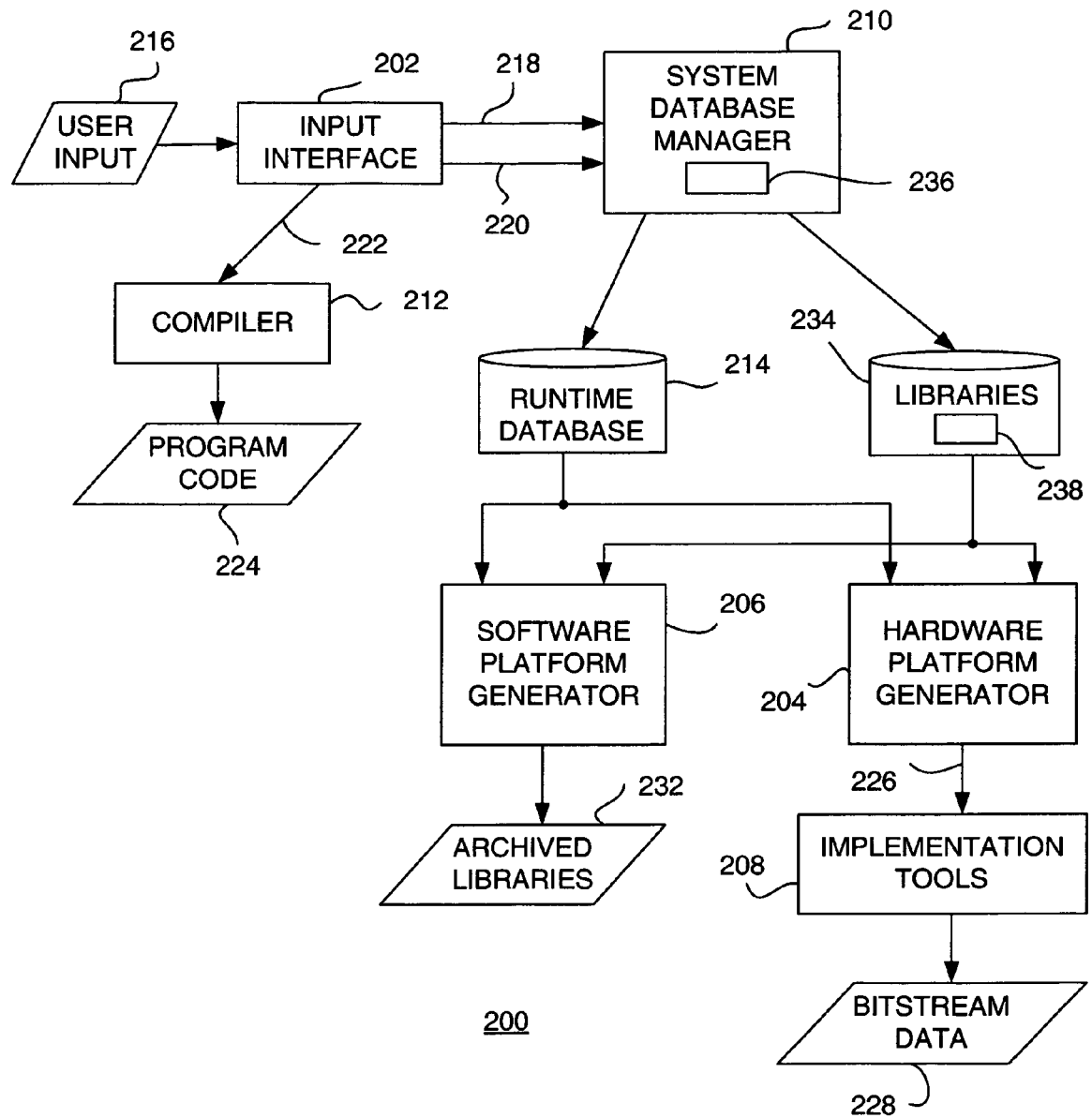
FIG. 2 is a block diagram depicting an exemplary embodiment of a system for designing an embedded system for an FPGA in accordance with an embodiment of the invention.

FIG. 2 is a block diagram depicting an exemplary embodiment of a system 200 for designing an embedded system for an FPGA in accordance with an embodiment of the invention. The system 200 is configured to implement the embedded system design in a target FPGA in response to user input data. Notably, the user may design application software in using self-implementing libraries that are a combination of hardware and software components ("hardware-software libraries"). The hardware components are implemented using FPGA fabric. The software components may be implemented using an embedded processor. The hardware-software libraries are presented to the user as software libraries that can be invoked from within the user's application software. A hardware-software library is configured to allow automatic modification of the hardware platform of the system to include the hardware components necessary for implementation of the software components. The user of the hardware-software library need not be aware of the architectural elements involved in creating the hardware.

In particular, the system 200 comprises an input section 202, a hardware platform generator 204, a software platform generator 206, implementation tools 208, a system database manager 210, and a software compiler 212. The input section 202 is configured to receive user input data 216 and to generate software platform data 218, hardware platform data 220, and application software 222 in response thereto. The hardware platform data 220 defines various hardware components of the embedded system, such as one or more processors, peripherals, busses, memories, and like-type hardware components known in the art.

The software platform data 218 defines various software components of the embedded system, such as drivers for peripherals and the processor(s), customization parameters for libraries to be used in the embedded system (e.g., hardware-software libraries), interrupt handler routines, customization parameters of operating systems (OSs) to be used in the embedded system, and like-type software features known in the art. The application software 222 includes the code that is executed by the hardware platform data 220 in the context of the software platform 218. The application software 222 may be written using a programming language, such as assembly language, C, C++, and the like.

The system database manager 210 is configured to receive the hardware platform data 220 and the software platform data 218. The system database manager 210 builds a runtime database of the embedded system design ("runtime database 214") from the software platform data 218 and the hardware platform data 220. The runtime database 214 stores the current state of the hardware/software architecture of the embedded system.

The hardware platform generator 204 is configured for communication with the runtime database 214. The hardware platform generator 204 generates implementation data 226 for the target FPGA from the hardware platform data stored in the runtime database 214. The implementation data 226 may include a hardware description language (HDL) description and/or a netlist description of the hardware platform for the embedded system design. The implementation tools 208 are configured to receive the implementation data 226. The implementation tools 208 produce bitstream data 228 for the target FPGA device using a well known implementation process. Notably, the implementation data 226 is synthesized, mapped, placed, and routed for the target FPGA device.

The hardware platform generator 204 is also in communication with a libraries database 234. The libraries database 234 stores pre-defined libraries for use by the user in the design of an embedded system. Exemplary libraries include hardware cores (e.g., an Ethernet controller), software libraries, and hardware-software libraries of an embodiment of the invention. Notably, a hardware-software library includes one or more functions that the user can use in the application software 222.

Figure 3:
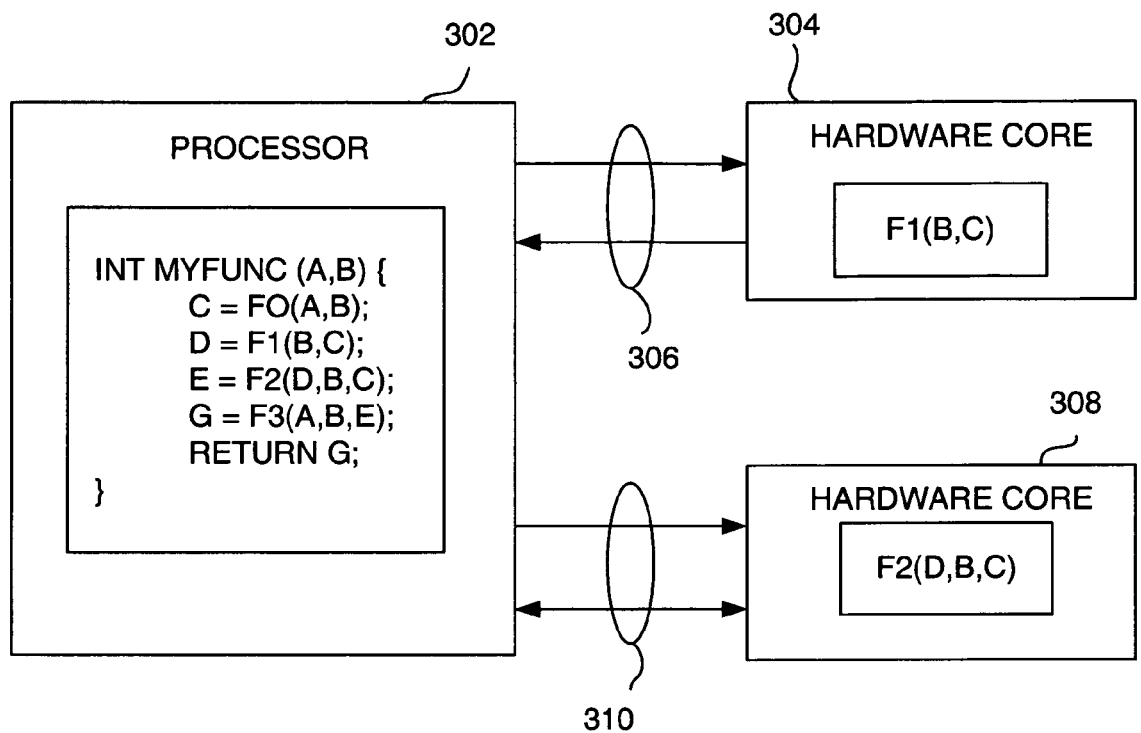
FIG. 3 is a block diagram depicting an architectural implementation of an exemplary hardware-software library function.

FIG. 3 is a block diagram depicting an architectural implementation of an exemplary hardware-software library function. In the present example, a processor 302 is coupled to a hardware core 304 via a link 306, and a hardware core 308 via a link 310. For example, the processor 302 may be a MICROBLAZE embedded soft processor and the hardware cores 304 and 306 may be coupled to the MICROBLAZE processor using fast-simplex link (FSL) channels. The processor 302 implements a function, MYFUNC, which includes calls to four functions, F0, F1, F2, and F3. The functions F0 and F3 comprise software functions that are implemented by the processor 302. The function F1 is implemented by the hardware core 304. The function F2 is implemented by the hardware core 306.

The function MYFUNC may be part of a self-implementing hardware-software library, LIBMYFUNC. The function MYFUNC in the library LIBMYFUNC may then be used in any software program that is written for the processor 302. For example, the code below uses MYFUNC as one of the functions:

```
void main( ) {
int A, B, C, D;
A = foo(B);
C = MYFUNC(A,B);
D = foo2(A,B,C);
}
```

In order for a user to use the MYFUNC function, the hardware components, namely the hardware core 304 and the hardware core 308, needs to be present and connected to the processor 302 in the specified hardware platform for the embedded system. As described below, the system 200 automatically modifies the hardware platform to include the hardware cores 304 and 308 if such hardware components are not present.

Returning to FIG. 2, the software platform generator 206 is configured for communication with the runtime database 214 and the libraries database 234. The software platform generator 206 generates archived library data 232 for the embedded system from the hardware platform data and software platform data stored in the runtime database 214. In particular, the software platform generator 206 configures and compiles libraries in accordance with the software platform data. For each library referenced in the software platform data, the software platform generator 206 checks the runtime database 214 to determine if the library is a hardware-software library. For a hardware-software library, the software platform generator 206 retrieves hardware component dependency data associated with the library. The hardware component dependency data indicates which hardware components are required by the library.

The software platform generator 206 then checks the runtime database 214 to determine whether the hardware platform of the embedded design system includes the hardware components required by the library. If the hardware platform does not include the required hardware components, the software platform generator 206 updates the runtime database by automatically adding the required hardware components to the hardware platform of the system.

The compiler 212 is configured to receive the application software 222. The compiler 212 compiles the application software 222 in a well known manner to produce executable program data 224. Together, the bitstream data 228, the archived libraries 232, and the program code 224 may be used to implement an embedded system using an FPGA.

Figure 4:
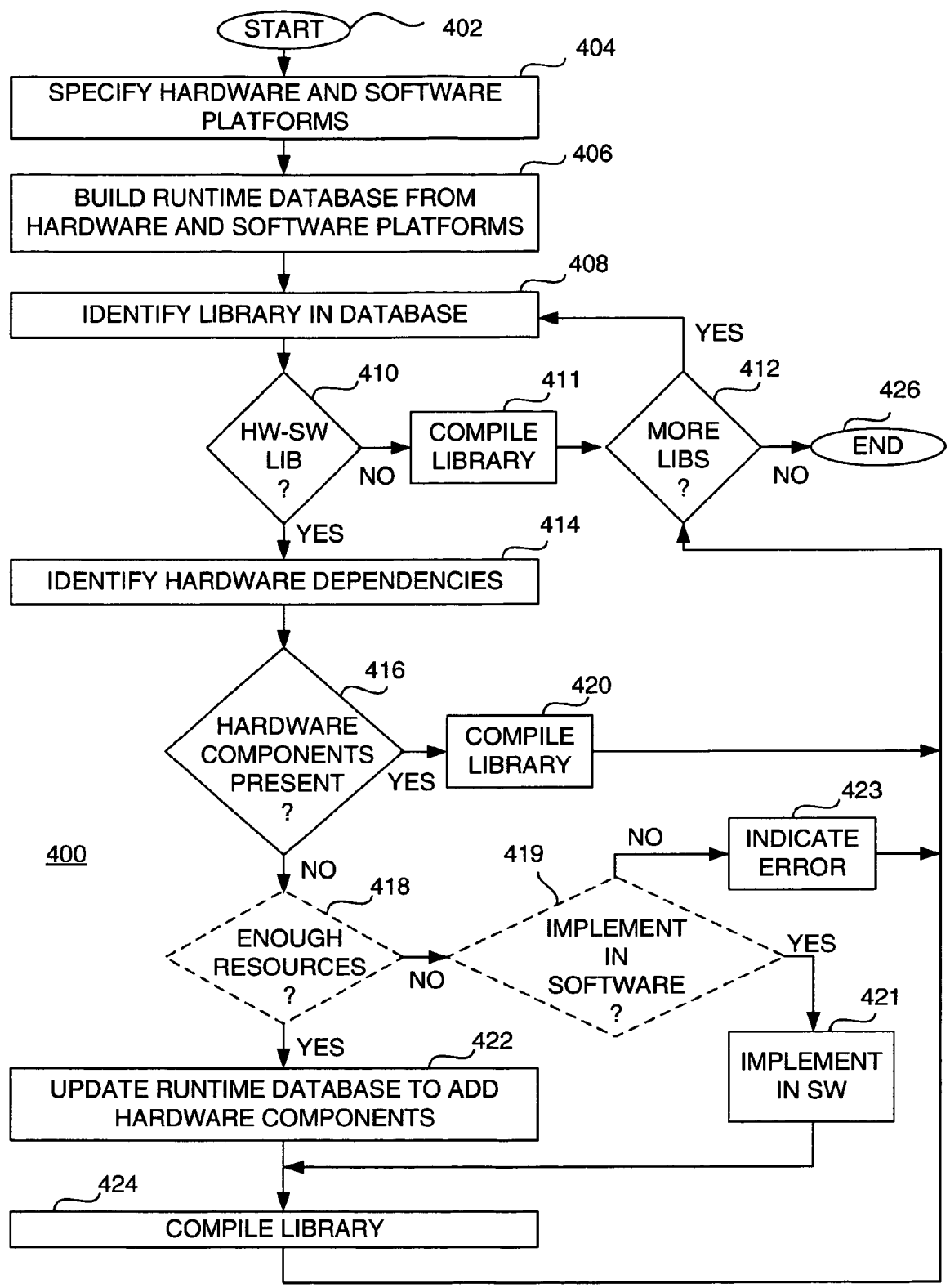
FIG. 4 is a flow diagram depicting an exemplary embodiment of a method for designing an embedded system for an integrated circuit in accordance with an embodiment of the invention.

FIG. 4 is a flow diagram depicting an exemplary embodiment of a method 400 for designing an embedded system for an integrated circuit in accordance with an embodiment of the invention. The method 400 begins at step 402. At step 404, the hardware and software platforms of the system are specified. At step 406, a runtime database of the system is built using the specified hardware and software platforms. At step 408, a library is identified in the runtime database. At step 410, a determination is made as to whether the identified library is a hardware-software library. If not, the method 400 proceeds to step 411. At step 411, the library is compiled to produce an archived library. The method 400 then proceeds to step 412, where a determination is made as to whether there are more libraries to process. If so, the method 400 returns to step 408. Otherwise, the method 400 ends at step 426.

If, at step 410, the identified library is a hardware-software library, the method 400 proceeds to step 414. At step 414, hardware component dependencies associated with the identified hardware-software library are identified. At step 416, the runtime database is processed to determine if the hardware components are present. If so, the method 400 proceeds to step 420, where the library is compiled to produce an archived library. Otherwise, the method 400 proceeds to step 422. At step 422, the runtime database is updated to add the hardware components. At step 424, the library is compiled to produce an archived library.

In another embodiment, if the hardware components are not part of the hardware platform at step 416, the method proceeds to step 418. At step 418, the runtime database is processed to determine if the integrated circuit includes resources to implement the hardware components. If so, the method 400 proceeds to step 422. Otherwise, the method 400 proceeds to step 419. At step 419, a determination is made as to whether the hardware components can be implemented using software. If so, the method 400 proceeds to step 421, where the hardware components are implemented using software. The method 400 then proceeds to step 424. Otherwise, the method 400 proceeds to step 423, where an error is indicated to the user. The method 400 then returns to step 412.

Figure 5:
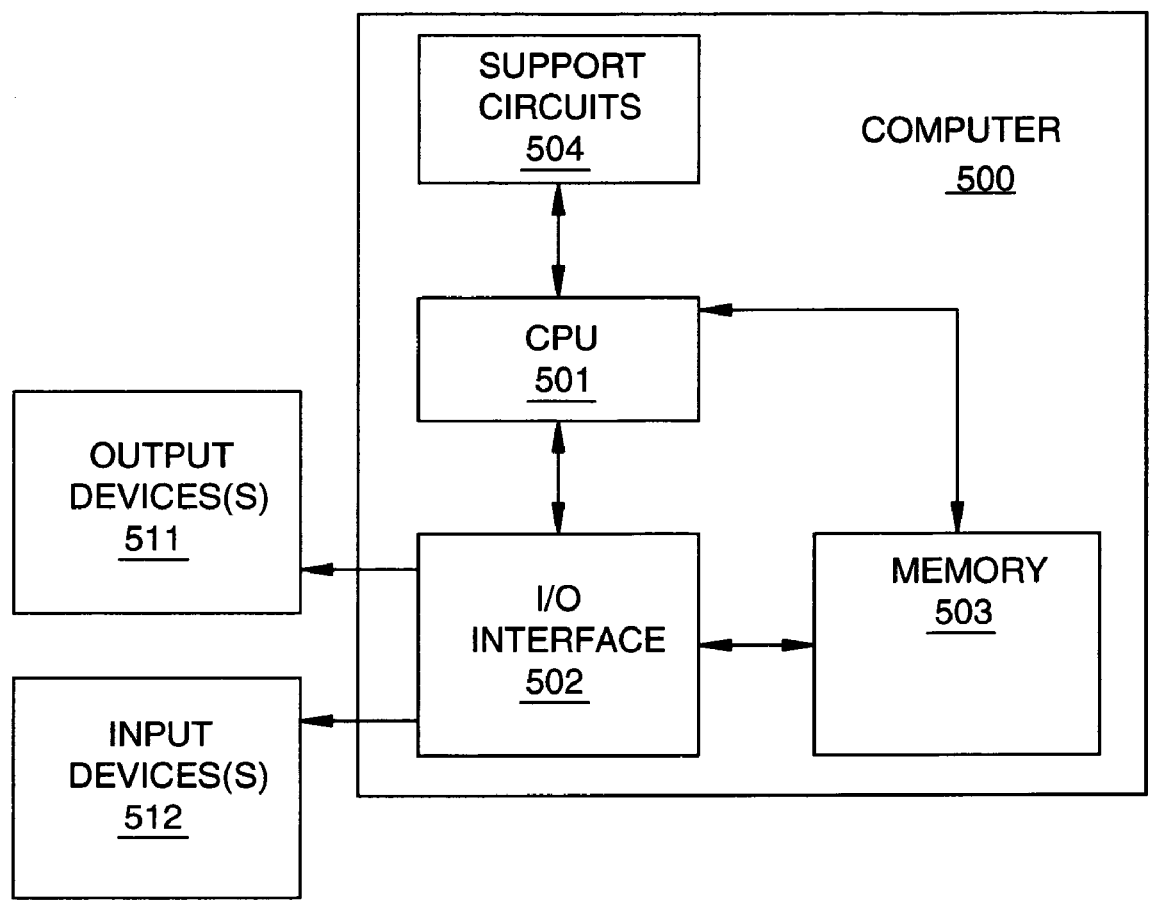
FIG. 5 is a block diagram depicting an exemplary embodiment of a computer suitable for implementing the processes and methods described herein.

FIG. 5 is a block diagram depicting an exemplary embodiment of a computer 500 suitable for implementing the processes and methods described herein. For example, the computer 500 may be used to implement the system 200 of FIG. 2 and the method 400 of FIG. 4. The computer 500 includes a central processing unit (CPU) 501, a memory 503, various support circuits 504, and an I/O interface 502. The CPU 501 may be any type of microprocessor known in the art. The support circuits 504 for the CPU 501 include conventional cache, power supplies, clock circuits, data registers, I/O interfaces, and the like. The I/O interface 502 may be directly coupled to the memory 503 or coupled through the CPU 501. The I/O interface 502 may be coupled to various input devices 512 and output devices 511, such as a conventional keyboard, mouse, printer, display, and the like.

The memory 503 may store all or portions of one or more programs and/or data to implement the processes and methods described herein. Although one or more aspects of the invention are disclosed as being implemented as a computer executing a software program, those skilled in the art will appreciate that the invention may be implemented in hardware, software, or a combination of hardware and software. Such implementations may include a number of processors independently executing various programs and dedicated hardware, such as ASICs.

The computer 500 may be programmed with an operating system, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in the memory 503. The memory 503 may include one or more of the following random access memory, read only memory, magneto-resistive read/write memory, optical read/write memory, cache memory, magnetic read/write memory, and the like, as well as signal-bearing media as described below.

An aspect of the invention is implemented as a program product for use with a computer system. Program(s) of the program product defines functions of embodiments and can be contained on a variety of signal-bearing media, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

The invention claimed is:

1. A method of designing an embedded system for an integrated circuit, comprising:
    defining a hardware platform;
    defining a software platform having a plurality of software components, said plurality of software components including a library;
    identifying hardware component dependency data associated with said library, said hardware component dependency data indicative or at least one hardware component required by the library;
    automatically adding the at least one hardware component to said hardware platform in response to said hardware component dependency data
    Wherein said step of automatically adding comprises:
        building a runtime database to store a current state of said hardware platform and said software platform;
        querying said runtime database to determine whether said hardware platform includes a hardware architecture defined by said hardware component dependency data; and
        modifying said hardware platform to include said at least one hardware component in response to at least a portion of said hardware architecture being absent in said hardware platform;
    compiling program code associated with said library to produce an archived library; and
    implementing said hardware platform for said integrated circuit.

2. The method of claim 1, wherein said step of automatically adding further comprises:
    querying said runtime database to determine whether said integrated circuit includes resources to implement said hardware architecture;
    said hardware platform being modified to include said at least one hardware component further in response to said integrated circuit including said resources.

3. The method of claim 1, wherein said hardware platform includes a microprocessor embedded within said integrated circuit.

4. The method of claim 3, wherein said at least one hardware component includes an interface to said microprocessor and a peripheral device coupled to said microprocessor via said interface.

5. The method of claim 3, wherein said software platform is configured for implementation using said microprocessor.

6. Apparatus for designing an embedded system for an integrated circuit, comprising:

an input section for defining a hardware platform and a software platform, said software platform having a plurality of software components including a library; and
a system modification tool for identifying hardware component dependency data associated with said library, said hardware component dependency data indicative of at least one hardware component required by the library, and automatically adding the at least one hardware component to said hardware platform in response to said hardware component dependency data
a system database manager for building a runtime database to store a current state of said hardware platform and said software platform;
    wherein the system modification tool is configured to query the runtime database to determine whether the hardware platform includes a hardware architecture defined by the hardware component dependency data, and modify the hardware platform to include said at least one hardware component in response to at least a portion of said hardware architecture being absent in said hardware platform;
a compiler for compiling program code associated with said library to produce an archived library; and
a implementation tool for implementing said hardware platform for said integrated circuit.

7. The apparatus of claim 6, wherein said system modification tool is further configured to query said runtime database to determine whether said integrated circuit includes resources to implement said hardware architecture, said hardware platform being modified to include said at least one hardware component further in response to said integrated circuit including said resources.

8. The apparatus of claim 6, wherein said hardware platform includes a microprocessor embedded within said integrated circuit.

9. The apparatus of claim 8, wherein said at least one hardware component includes an interface to said microprocessor and a peripheral device coupled to said microprocessor via said interface.

10. The apparatus of claim 8, wherein said software platform is configured for implementation using said microprocessor.

11. Apparatus for designing an embedded system for an integrated circuit, comprising:
    means for defining a hardware platform;
    means for defining a software platform having a plurality of software components, said plurality of software components including a library;
    means for identifying hardware component dependency data associated with said library, said hardware component dependency data indicative of at least one hardware component required by the library;
    means for automatically adding the at least one hardware component to said hardware platform in response to said hardware component dependency data
    Wherein said means for automatically adding comprises:
        means for building a runtime database to store a current state of said hardware platform and said software platform;
        means for querying said runtime database to determine whether said hardware platform includes a hardware architecture defined by said hardware component dependency data; and means for modifying said hardware platform to include said at least one hardware component in response to at least a portion of said hardware architecture being absent in said hardware platform;

means for compiling program code associated with said library to produce an archived library; and means for implementing said hardware platform for said integrated circuit.

12. The apparatus of claim 11, wherein said means for automatically adding further comprises:

means for querying said runtime database to determine whether said integrated circuit includes resources to implement said hardware architecture;

said hardware platform being modified to include said at least one hardware component further in response to said integrated circuit including said resources.

13. The apparatus of claim 11, wherein said hardware platform includes a microprocessor embedded within said integrated circuit.

14. The apparatus of claim 13, wherein said at least one hardware component includes an interface to said microprocessor and a peripheral device coupled to said microprocessor via said interface.

15. The apparatus of claim 13, wherein said software platform is configured for implementation using said microprocessor.

* * * * *